(12) United States Patent
Horii et al.

(10) Patent No.: US 10,173,390 B2
(45) Date of Patent: Jan. 8, 2019

(54) FIBER MOLDED ARTICLE

(71) Applicant: Kabushiki Kaisha Toshiba, Minato-ku, Tokyo (JP)

(72) Inventors: Yasuyuki Horii, Ome Tokyo (JP); Kazuo Ito, Mitaka Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 484 days.

(21) Appl. No.: 14/936,521

(22) Filed: Nov. 9, 2015

(65) Prior Publication Data

US 2016/0316581 A1     Oct. 27, 2016

Related U.S. Application Data

(60) Provisional application No. 62/152,638, filed on Apr. 24, 2015.

(51) Int. Cl.
| | |
|---|---|
| H05K 5/02 | (2006.01) |
| B29C 70/54 | (2006.01) |
| B32B 1/02 | (2006.01) |
| B29C 43/02 | (2006.01) |
| H05K 5/00 | (2006.01) |
| B32B 3/02 | (2006.01) |
| B32B 3/08 | (2006.01) |
| H05K 5/03 | (2006.01) |

(Continued)

(52) U.S. Cl.
CPC .............. *B32B 1/02* (2013.01); *B29C 43/021* (2013.01); *B29C 70/54* (2013.01); *B29C 70/545* (2013.01); *B32B 3/02* (2013.01); *B32B 3/08* (2013.01); *H05K 5/0004* (2013.01); *H05K 5/0017* (2013.01); *H05K 5/0026* (2013.01); *H05K 5/0047* (2013.01); *H05K 5/0069* (2013.01); *H05K 5/02* (2013.01); *H05K 5/03* (2013.01); *B29K 2101/12* (2013.01); *B29L 2031/3481* (2013.01)

(58) Field of Classification Search
CPC .. H05K 5/0004; H05K 5/0017; H05K 5/0026; H05K 5/0047; H05K 5/0069; H05K 5/02; H05K 5/03; B32B 1/02; B32B 3/02; B32B 3/08; B29C 43/021; B29C 70/54; B29C 70/545

See application file for complete search history.

(56) References Cited

U.S. PATENT DOCUMENTS

2008/0241456 A1* 10/2008 Kunthady ............... B32B 27/00
428/71

FOREIGN PATENT DOCUMENTS

| | | |
|---|---|---|
| CN | 102285017 A | 12/2011 |
| JP | 2003-258432 A | 9/2003 |

(Continued)

*Primary Examiner* — Walter Aughenbaugh
(74) *Attorney, Agent, or Firm* — Knobbe, Martens, Olson & Bear, LLP

(57) ABSTRACT

According to one embodiment, a fiber molded article includes fiber impregnated with thermoplastic resin, a plane base portion molded from the fiber, and a wall portion molded from the fiber and extending to an outside of a surface of the base portion to form an outer edge of the base portion. The wall portion has a through-hole. An entire periphery of an inner peripheral surface of the through-hole is covered with a film. The film is formed by melting the thermoplastic resin soaked into the fiber on the inner peripheral surface.

7 Claims, 7 Drawing Sheets

(51) Int. Cl.
    *B29K 101/12*     (2006.01)
    *B29L 31/34*     (2006.01)

(56) References Cited

FOREIGN PATENT DOCUMENTS

| | | |
|---|---|---|
| JP | 2009-078519 A | 4/2009 |
| JP | 2009-090475 A | 4/2009 |

\* cited by examiner

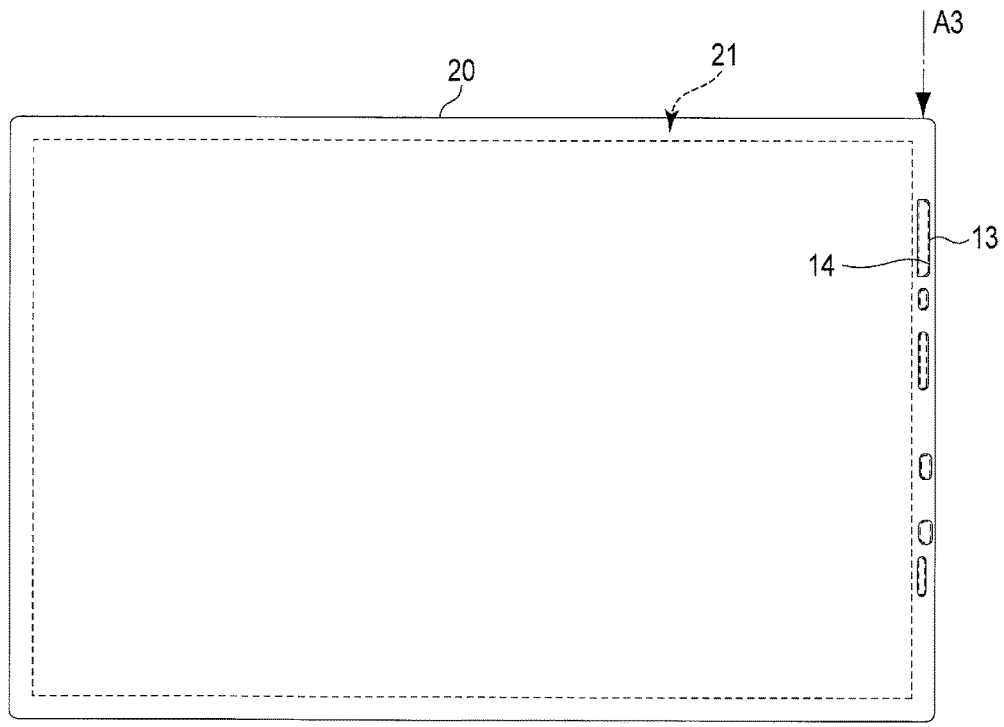
F I G. 3
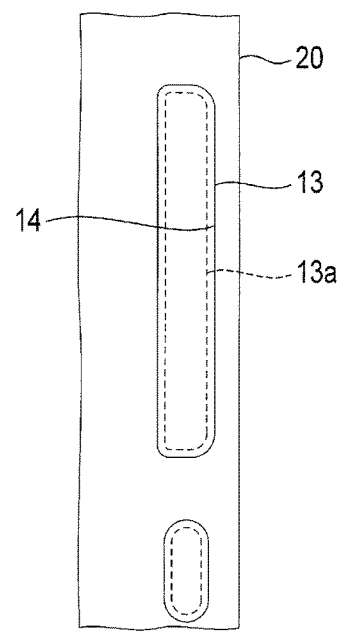
F I G. 4

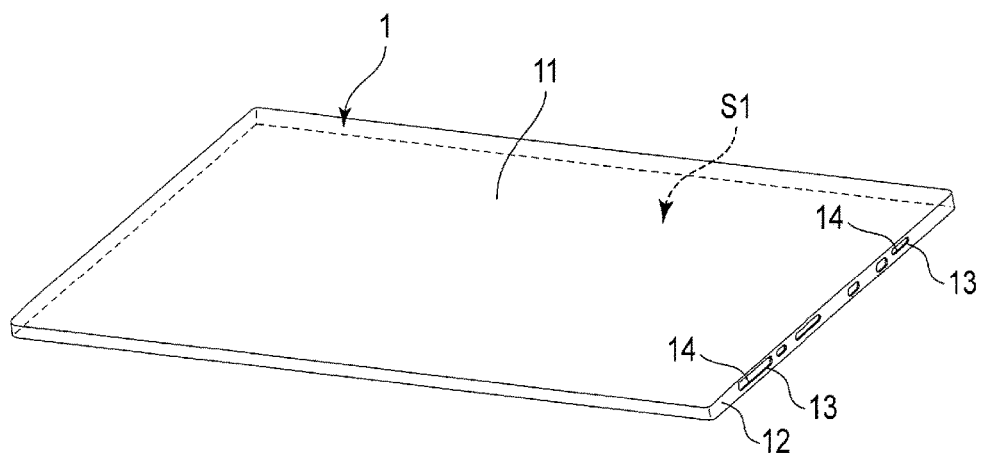
F I G. 5
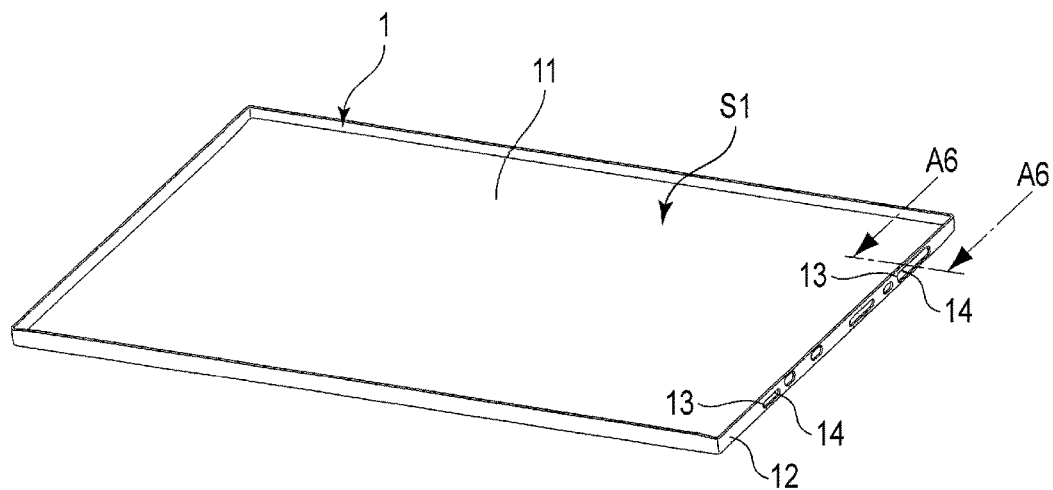
F I G. 6

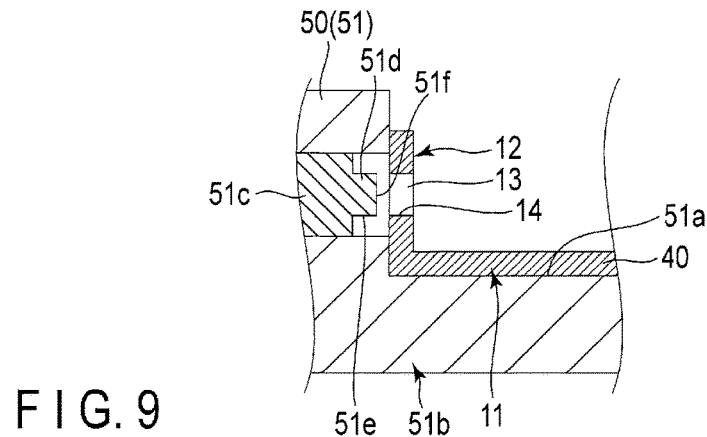
F I G. 9
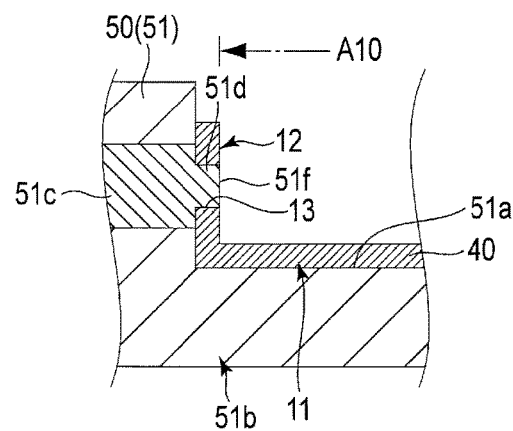
F I G. 10
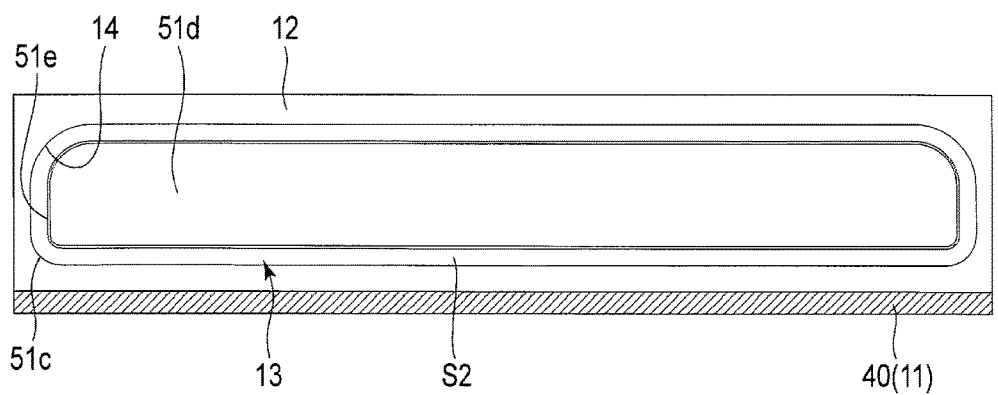
F I G. 11

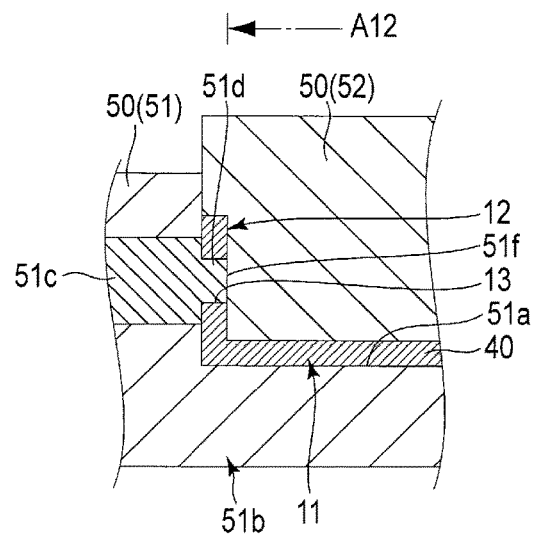
F I G. 12
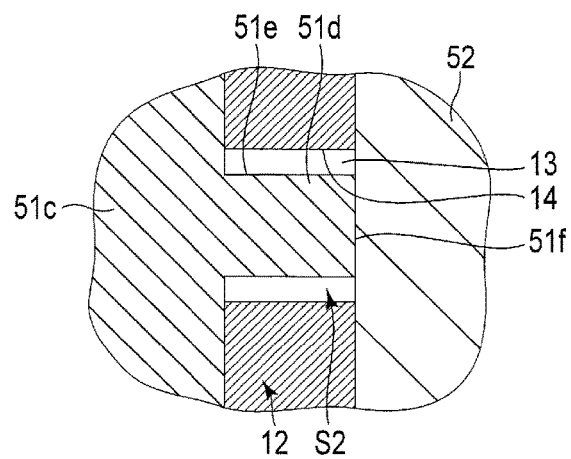
F I G. 13
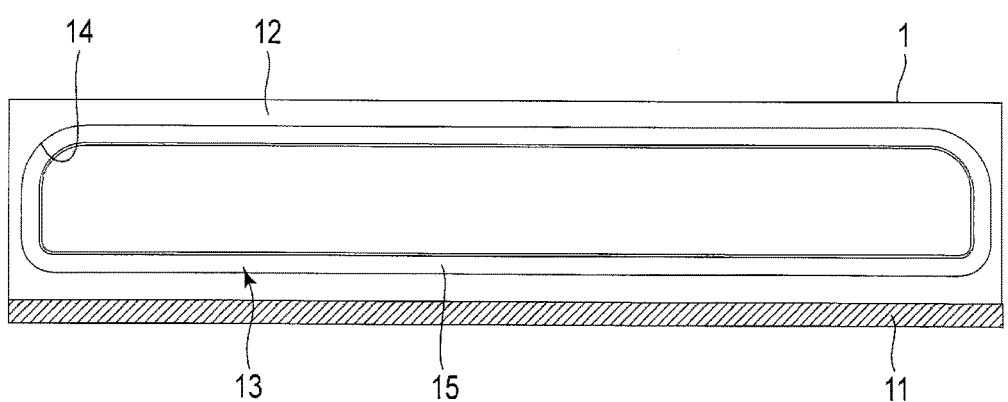
F I G. 14

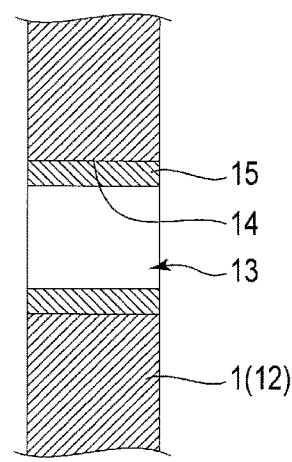
F I G. 15
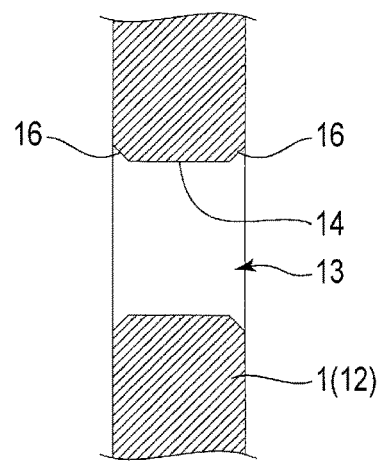
F I G. 16
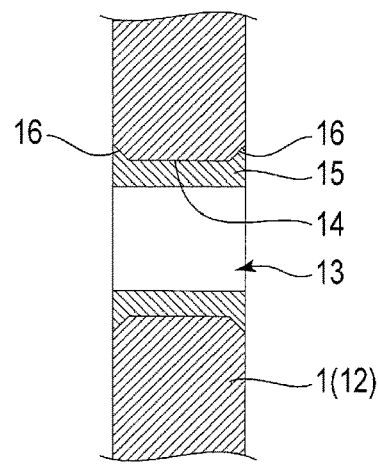
F I G. 17

FIBER MOLDED ARTICLE

CROSS-REFERENCE TO RELATED APPLICATIONS

This application claims the benefit of U.S. Provisional Application No. 62/152,638, filed Apr. 24, 2015, the entire contents of which are incorporated herein by reference.

FIELD

Embodiments described herein relate generally to a fiber molded article.

BACKGROUND

Fiber reinforced resin formed by impregnating carbon or glass fiber with resin is known. The fiber reinforced resin has special characteristics of being lightweight and having high strength.

In a molded article molded from the fiber reinforced resin by, for example, press working, a cross-section is often bared at an edge or end. In this case, the fiber may be exposed on the cross-section of the molded article and the exposed fiber may fall out of the cross-section. For example, carbon fiber that falls out of the inner peripheral surface of a through-hole formed in the molded article and contacts the skin may cause itching.

For this reason, the cross-section of the molded article of the fiber reinforced resin needs to be processed to prevent the fiber from being exposed on the cross-section. For example, the molded article must be subjected to, for example, insert molding to perform processing such as covering the cross-section with resin. Therefore, the cross-section of the molded article is required to be processed more efficiently when molding the fiber reinforced resin.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 3 is an exemplary plan view of a plate material to be molded into the molded article of FIG. 1.

FIG. 4 is an exemplary enlarged plan view of a through-hole of the plate material of FIG. 3.

FIG. 5 is an exemplary perspective illustration of a primary molded material molded from the plate material of FIG. 3.

FIG. 6 is an exemplary perspective illustration of the primary molded material of FIG. 5 from a different perspective from FIG. 5.

FIG. 9 is an exemplary cross-sectional view showing a state where the primary molded material of FIG. 8 is placed on the mold to form a film on the through-hole of the primary molded material, from the direction indicated by arrow A6 in FIG. 6.

FIG. 10 is an exemplary cross-sectional view showing a state where a slide of the mold is inserted into the through-hole of the primary molded material of FIG. 9, from the direction indicated by arrow A6 in FIG. 6.

FIG. 11 is an exemplary cross-sectional view showing a gap between the through-hole of the primary molded material of FIG. 10 and the slide of the mold, from the direction indicated by arrow A10 in FIG. 10.

FIG. 12 is an exemplary cross-sectional view showing a state where the primary molded material of FIG. 10 is pressed to form the film of the through-hole, from the direction indicated by arrow A6 in FIG. 6.

FIG. 13 is an exemplary enlarged cross-sectional view of the gap between the through-hole of the primary molded material of FIG. 12 and the slide of the mold.

FIG. 14 is an exemplary cross-sectional view showing a state where the gap shown in FIG. 13 is filled with molten resin from the through-hole of the primary molded material, from the direction indicated by arrow A12 in FIG. 12.

FIG. 15 is an exemplary cross-sectional view of the film of the through-hole from the direction indicated by arrow A2 of FIG. 2.

FIG. 16 is an exemplary cross-sectional view of a form of a through-hole in the other embodiment from the direction indicated by arrow A2 of FIG. 2.

FIG. 17 is an exemplary cross-sectional view of a form of a film in the other embodiment from the direction indicated by arrow A2 of FIG. 2.

DETAILED DESCRIPTION

Various embodiments will be described hereinafter with reference to the accompanying drawings. In general, according to one embodiment, a fiber impregnated with thermoplastic resin; a plane base portion molded from the fiber; and a wall portion molded from the fiber and extending to an outside of a surface of the base portion to form an outer edge of the base portion. The wall portion has a through-hole. An entire periphery of an inner peripheral surface of the through-hole is covered with a film. The film is formed by melting the thermoplastic resin soaked into the fiber on the inner peripheral surface.

A fiber molded article of one embodiment is hereinafter described by taking an electronic device including the molded article as a housing as an example with reference to FIG. 1 to FIG. 15. A molded article 1 is molded from fiber impregnated with thermoplastic resin. In the present embodiment, carbon fiber is applied as the fiber. However, other types of fiber such as glass fiber may also be used. As the thermoplastic resin, for example, polyetherimide, polyethersulfone or polyester is applied. However, other types of resin may also be applied as long as the resin can be repeatedly plasticated by heat.

Figure 1:
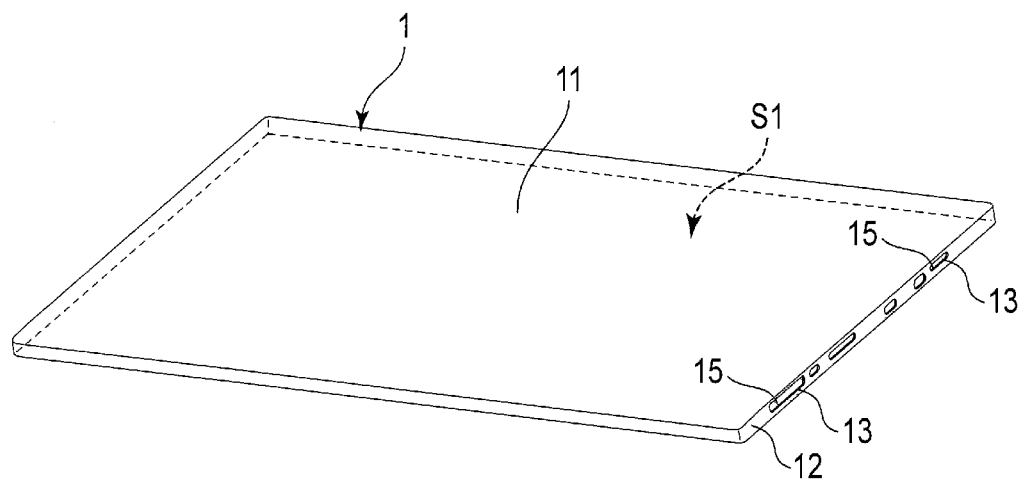
FIG. 1 is an exemplary perspective illustration of a molded article of an embodiment.

As shown in FIG. 1, the molded article 1 includes a base portion 11 and a wall portion 12. FIG. 1 exemplarily shows a form of the base portion 11 having a plane shaped in a rectangular flat plate. However, the shape of the base portion 11 is not limited to this, and can be varied depending on the use of the molded article 1. The wall portion 12 extends out of the surface of the base portion 11 and forms an outer edge of the base portion 11. FIG. 1 exemplarily shows a form of the wall portion 12 perpendicularly extending in one direction from the base portion 11 and formed in a frame surrounding the base portion 11. However, the wall portion 12 is not necessarily shaped in a frame, and may be partly cut off. The base portion 11 and the wall portion 12 form a box shape of the molded article 1.

The molded article 1 can be thereby configured as a housing which accommodates various components such as a control unit, a display unit and a storage unit mounted on the electronic device in a space S1 surrounded by the base portion 11 and the wall portion 12. For example, the molded article 1 can be used as a housing of an electronic device such as a tablet or a notebook computer.

Figure 2:
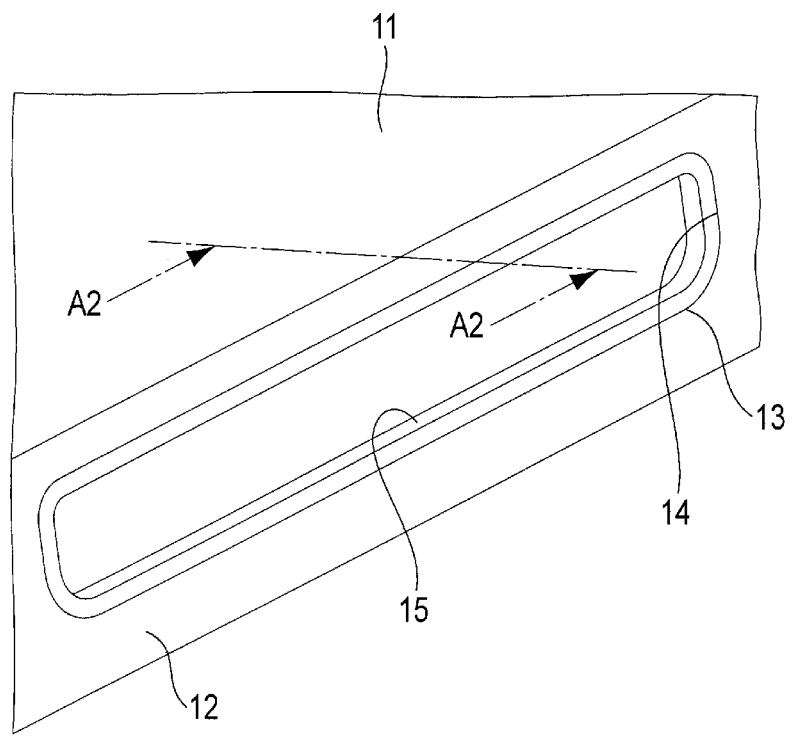
FIG. 2 is an exemplary enlarged perspective illustration of a through-hole of the molded article of FIG. 1.

As shown in FIG. 1 and FIG. 2, the wall portion 12 has through-holes 13 through which the space S1 communicates with the outside. For example, the through-hole 13 exposes a connecting portion connectable to an external device. More specifically, the through-holes 13 can be applied as Universal Serial Bus (USB) and High-definition Digital Media Interface (HDMI) ports, memory card slots, etc. The size and the number of the through-holes 13 can be arbitrarily set.

A film 15 is formed on an entire periphery of an inner peripheral surface 14 of each through-hole 13. In other words, the entire periphery of the inner peripheral surface 14 of each through-hole 13 is covered with the film 15. The film 15 is formed of the thermoplastic resin soaked into the fiber (carbon fiber) serving as a base material of the molded article 1. In this case, the thermoplastic resin soaked into the fiber is molten on the inner peripheral surfaces 14 of the through-holes 13, and the molten thermoplastic resin is solidified on the inner peripheral surfaces 14. The solidified thermoplastic resin is combined (integrated) with the inner peripheral surfaces 14 and becomes the films 15 covering the inner peripheral surfaces 14. That is, the films 15 are formed by heating and remelting the thermoplastic resin soaked into the fiber.

The inner peripheral surfaces 14 of the through-holes 13 are thereby covered with the films 15, which can prevent the fiber from being exposed (bared) on the inner peripheral surfaces 14. Since the fiber can be prevented from falling out of the inner peripheral surfaces 14 of the through-holes 13, for example, a problem caused by contact of carbon fiber with the skin can be avoided.

As described above, the molded article 1 of the present embodiment is characterized in that the inner peripheral surface 14 of each through-hole 13 is covered with the film 15 formed of the thermoplastic resin soaked into the fiber. An example of a molding method of the molded article 1 including a method of molding the film 15 on the inner peripheral surface 14 of each through-hole 13 is hereinafter described with reference to FIG. 3 to FIG. 15. As shown in FIG. 3 to FIG. 15, the molded article 1 is molded by punching and pressing a resin plate material 20 impregnated with the thermoplastic resin.

As shown in FIG. 3 and FIG. 4, when molding the molded article 1, the through-holes 13 are formed on the rectangular plate material 20. The through-holes 13 are formed by punching a region near the edge of each side of the plate material 20 (in FIG. 3, a region 21 sandwiched between each side of the plate material 20 and the broken line) by means of, for example, a computerized numerical control (CNC) device. The region near the edges of the plate material 20 in which the through-holes 13 are formed corresponds to a region which is to be the wall portion 12 of the molded article 1.

Considering that the film 15 is formed on each inner peripheral surface 14, each through-hole 13 is formed on the plate material 20 (wall portion 12) in a size obtained by enlarging a size (opening area) of a hole 13a essentially necessary for the molded article 1 into a similar figure by a thickness of the film 15. That is, an opening area of the through-hole 13 accounts for a minimum necessary opening area and a thickness of the film 15. Therefore, the opening area of the through-hole 13 is reduced by the thickness of the film 15 and the hole 13a of the essentially necessary size can be formed on the molded article 1 by forming the film 15 on the entire periphery of the inner peripheral surface 14. The size of the hole 13a essentially necessary for the molded article 1 is, for example, an opening area on the wall portion 12 needed for inserting a connector conforming to various standards to connect another device to the electronic device into the connecting portion of the electronic device.

As shown in FIG. 5 and FIG. 6, the plate material 20 on which the through-holes 13 are formed is bent between the region near the edge of each side (i.e., the region in which the through-holes 13 are formed) and the inner side thereof. The region near the edges of the plate material 20 is thereby formed into the wall portion 12 and the inner side thereof is formed into the base portion 11.

Figure 7:
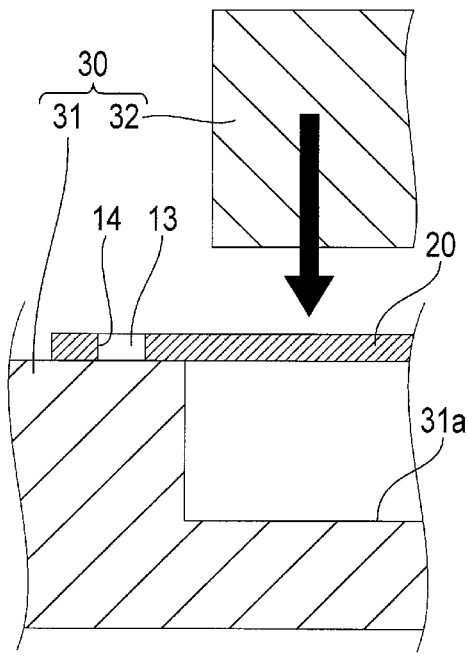
FIG. 7 is an exemplary cross-sectional view showing a state where the plate material of FIG. 3 is placed on a mold to mold the plate material into the primary molded material, from the direction indicated by arrow A3 in FIG. 3.
Figure 8:
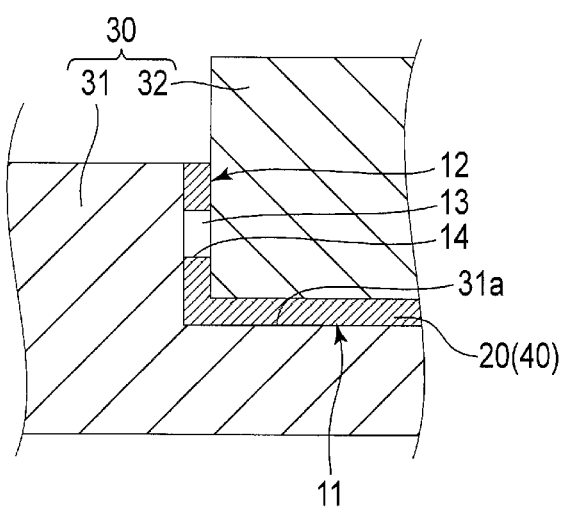
FIG. 8 is an exemplary cross-sectional view showing a state where the plate material of FIG. 7 is pressed and molded into the primary molded material, from the direction indicated by arrow A6 in FIG. 6.

FIG. 7 and FIG. 8 show an example of a method of molding the wall portion 12 corresponding to a side surface of the molded article 1 in a mold assembly 30. The mold assembly 30 has a static first mold 31 and a movable second mold 32. The first mold 31 has a cavity 31a indented to correspond to a form of bending the plate material 20 (i.e., a form of the base portion 11 and the wall portion 12). The second mold 32 is configured to move into and out of the cavity 31a.

As shown in FIG. 7, when molding the wall portion 12, the plate material 20 is placed on the first mold 31 across the cavity 31a. In this state, the second mold 32 is moved into the cavity 31a and the plate material 20 is pressed into the cavity 31a by the moved second mold 32. A pressure, temperature and time in pressing the plate material 20 into the cavity 31a are arbitrarily set depending on, for example, a quality of the plate material 20. The plate material 20 is thereby molded into the frame wall portion 12 on the outer edge and the base portion 11 surrounded by the wall portion 12. The through-holes 13 are formed on the wall portion 12. The plate material 20 thus molded is hereinafter referred to as a primary molded material 40. The through-holes 13 are formed on the wall portion 12 in the primary molded material 40.

As shown in FIG. 9 to FIG. 15, the film 15 is formed on the inner peripheral surface 14 of each through-hole 13 by press working in the primary molded material 40. FIG. 9 to FIG. 15 show an example of a method of molding the film 15 in a mold assembly 50 on each through-hole 13 of the wall portion 12 corresponding to the side surface of the molded article 1. The mold assembly 50 includes a static third mold 51 and a movable fourth mold 52. The third mold 51 has a cavity 51a indented to correspond to the form of the base portion 11 and the wall portion 12 of the primary molded material 40. The third mold 51 has a slide 51c movable with respect to a static mold body 51b. The slide 51c includes a protruding portion 51d having a cross-section area of a similar figure smaller than the opening area of the through-hole 13. A length of protrusion of the protruding portion 51d is equal to a hole depth of the through-hole 13 (corresponding to a thickness of the plate material 20). The fourth mold 52 is configured to move into and out of the cavity 51a.

As shown in FIG. 9, when molding the film 15, the primary molded material 40 is positioned and disposed in the cavity 51a of the third mold 51. Next, as shown in FIG. 10, the slide 51c of the third mold 51 is moved toward the through-hole 13 and the protruding portion 51d is inserted into the through-hole 13 of the primary molded material 40. In this state, as shown in FIG. 11, a gap S2 is formed between a peripheral surface 51e of the protruding portion 51d and the entire periphery of the inner peripheral surface 14 of the through-hole 13. Then, as shown in FIG. 12, the fourth mold 52 is moved into the cavity 51a to press the primary molded material 40 by a predetermined pressure. In this case, as shown in FIG. 13, the fourth mold 52 contacts a protruding end 51f of the protruding portion 51d.

In this state, the primary molded material 40 is heated to a temperature at which the thermoplastic resin soaked into the fiber constituting the primary molded material 40 is molten, and the heated primary molded material 40 is pressed for a predetermined time. By such hot pressing, the thermoplastic resin soaked into the fiber is molten on the inner peripheral surface 14 of the through-hole 13 of the primary molded material 40. The molten resin flows into the gap S2 and fills the gap S2 as shown in FIG. 14. In this state, the primary molded material 40 is cooled to a temperature at which the thermoplastic resin is hardened. By cooling the primary molded material 40, the thermoplastic resin that fills the gap S2 is solidified and the film 15 is molded on the entire periphery of the inner peripheral surface 14 of the through-hole 13 as shown in FIG. 15. The molded article 1 (FIG. 1 and FIG. 2) which is a secondary molded article in which the inner peripheral surface 14 of each through-hole 13 is covered with the film 15 can be thereby molded.

The film 15 is molded in accordance with a form of the gap S2. That is, the thickness of the film 15 corresponds to an interval between the peripheral surface 51e of the protruding portion 51d and the inner peripheral surface 14 of the through-hole 13. Therefore, the cross-section area of the protruding portion 51d and the opening area of the through-hole 13 are set in accordance with the thickness of the film 15 to be molded.

As described above, according to the present embodiment, the inner peripheral surface 14 of each through-hole 13 can be covered with the film 15. Since the fiber can be prevented from falling out of the inner peripheral surfaces 14 of the through-holes 13, for example, a problem caused by contact of carbon fiber with the skin can be avoided.

In addition, since the films 15 are molded from the thermoplastic resin soaked into the fiber, for example, it is not necessary to perform insert molding, etc., by separately injecting resin into the primary molded material 40 to cover the inner peripheral surfaces 14. Since the molded article 1 having the films 15 can be molded merely by the hot pressing of the primary molded material 40, the work can be simplified.

In the above-described embodiment, the through-hole 13 is a cylindrical hole having a constant hole diameter. Instead, as shown in FIG. 16, the through-hole 13 may be formed by sloping opening portions at both ends to enlarge a diameter of each opening portion toward the outside in the direction of the axis of the hole (axis in the depth direction of the through-hole 13). That is, the through-hole 13 has a diameter of an opening portion larger toward one end of the through-hole 13. In this case, the area of the inner peripheral surface 14 of the through-hole 13 is expanded by sloping surfaces 16 in comparison with the form shown in FIG. 15.

FIG. 17 shows a form of the film 15 in the case where the through-hole 13 has such a form. As shown in FIG. 17, the film 15 has a thickness larger toward the outside in the hole axis direction of the through-hole 13 on the sloping surfaces 16 of the through-hole 13. Therefore, the inner peripheral surface 14 of the through-hole 13 and the film 15 are integrally combined with each other in comparison with the form shown in FIG. 15, which can more reliably prevent the fiber from falling out of the boundary region between the inner peripheral surface 14 and the film 15 in each opening portion of the through-hole 13.

FIG. 16 and FIG. 17 show the form of the through-hole 13 in which the opening portions at both the ends are sloped, but the through-hole 13 may have a form of merely sloping an opening portion on the side of one end. For example, a sloping surface 16 may be provided in one of the opening portions of the through-hole 13 on the side of the external surface of the wall portion 12 (i.e., on the opposite side of the space S1 in FIG. 1). Even in this case, the fiber can be reliably prevented from falling out of the external surface of the wall portion 12 which is easy to contact the hand. Therefore, the fiber can be sufficiently prevented from contacting the skin.

The wall portion 12 and the films 15 are molded in the different mold assemblies 30 and 50 in the above-described embodiment, but may be molded in the same mold assembly. In this case, the wall portion 12 and the films 15 can be molded at the same time and, for example, a rib, tab, boss and the like can also be molded together. In other words, the wall portion 12, the lib and the like can be molded at the same time as the films 15. Therefore, the efficiency of the molding operation of the molded article 1 can be more improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A fiber molded article comprising:
a plane base portion;
a wall portion forming an outer edge around the base portion; and
a through-hole provided in a part of the wall portion,
the base portion and the wall portion molded from fiber impregnated with thermoplastic resin,
an inner surface of the through-hole covered with a melted and re-solidified film of the thermoplastic resin which impregnates the fiber.
2. The fiber molded article of claim 1, wherein
an opening area of the through-hole in the wall portion is reduced by a thickness of the film.
3. The fiber molded article of claim 1, wherein
a diameter of an opening portion at one end of the through-hole in the wall portion is larger than a diameter of another portion of the through-hole.
4. An electronic device comprising a housing, the housing comprising:
a plane base portion;
a wall portion forming an outer edge around the base portion; and
a through-hole provided in a part of the wall portion,
the base portion and the wall portion molded from fiber impregnated with thermoplastic resin, an inner surface of the through-hole covered with a melted and re-solidified film of the thermoplastic resin which impregnates into the fiber.

5. The electronic device of claim 4, wherein an opening area of the through-hole in the housing is reduced by a thickness of the film.

6. The electronic device of claim 4, wherein a diameter of an opening portion at one end of the through-hole in the housing is larger than a diameter of another portion of the through-hole.

7. A method for manufacturing a fiber molded article, the method comprising:
- forming a plane base portion and a wall portion, the wall portion forming an outer edge around the base portion, the base portion and the wall portion molded from fiber impregnated with thermoplastic resin;
- forming a through-hole in a part of the wall portion;
- hot-pressing the fiber impregnated with the thermoplastic resin;
- melting the thermoplastic resin on an inner surface of the through-hole;
- forming a film covering the inner surface of the through-hole by the molten thermoplastic resin; and
- re-solidifying the film.

* * * * *